(12) United States Patent
Lee (10) Patent No.: US 7,495,486 B2
(45) Date of Patent: Feb. 24, 2009

(54) SEMICONDUCTOR MEMORY DEVICE

(75) Inventor: Joo-Ae Lee, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 74 days.

(21) Appl. No.: 11/647,146

(22) Filed: Dec. 29, 2006

(65) Prior Publication Data

US 2008/0186781 A1 Aug. 7, 2008

(30) Foreign Application Priority Data

Sep. 29, 2006 (KR) .................. 10-2006-0096352

(51) Int. Cl.
 *H03L 7/06* (2006.01)
(52) U.S. Cl. .................. 327/158; 327/147; 327/156
(58) Field of Classification Search ......... 327/147–153, 327/156–161
 See application file for complete search history.

(56) References Cited

U.S. PATENT DOCUMENTS

| | | | | |
|---|---|---|---|---|
| 4,590,602 | A * | 5/1986 | Wolaver ............. | 375/375 |
| 6,038,276 | A * | 3/2000 | Dinh .................. | 375/376 |
| 6,097,227 | A * | 8/2000 | Hayashi .............. | 327/158 |
| 6,317,161 | B1 * | 11/2001 | Renner et al. ........ | 348/536 |
| 6,437,616 | B1 * | 8/2002 | Antone et al. ........ | 327/158 |
| 6,762,633 | B2 * | 7/2004 | Lee .................... | 327/158 |
| 6,844,761 | B2 * | 1/2005 | Byun et al. .......... | 327/149 |
| 6,912,012 | B2 * | 6/2005 | Renner et al. ........ | 348/536 |
| 6,937,664 | B1 * | 8/2005 | Park et al. ........... | 375/259 |
| 6,960,949 | B2 * | 11/2005 | Suzuki ............... | 327/157 |
| 6,963,234 | B2 * | 11/2005 | Bidenbach ........... | 327/158 |
| 7,015,725 | B1 * | 3/2006 | Yu et al. .............. | 327/12 |
| 7,053,683 | B2 * | 5/2006 | Li ..................... | 327/156 |
| 7,084,682 | B2 * | 8/2006 | Jeon et al. ........... | 327/158 |
| 7,167,527 | B1 * | 1/2007 | Park et al. ........... | 375/295 |
| 7,221,202 | B1 * | 5/2007 | Yayla ................. | 327/158 |

(Continued)

FOREIGN PATENT DOCUMENTS

KR 10-2004-0083342 10/2004

(Continued)

OTHER PUBLICATIONS

Korean Office Action, issued in Korean Patent Application No. KR 10-2006-0096352, dated on Feb. 1, 2008.

*Primary Examiner*—Lincoln Donovan
*Assistant Examiner*—Adam Houston
(74) *Attorney, Agent, or Firm*—McDermott Will & Emery LLP (57) ABSTRACT

A semiconductor memory device includes: a phase comparison unit for comparing a phase of a clock signal with a phase of a reference clock signal; a delay line for delaying the clock signal in response to the comparison result of the phase comparison unit to output the delayed clock signal as the reference clock signal; a first delay locking control unit for adjusting a delay amount of the delay line to generate a locking signal when a phase of an output signal output from the delay line is within a predetermined range; and a second delay locking control unit for adjusting a phase difference between the clock signal and the reference clock signal within a predetermined range in response to an activation of the locking signal so that the phase difference is corrected.

9 Claims, 6 Drawing Sheets

U.S. PATENT DOCUMENTS

| | | | | |
|---|---|---|---|---|
| 7,239,188 B1* | 7/2007 | Xu et al. | | 327/156 |
| 7,336,112 B1* | 2/2008 | Sha et al. | | 327/158 |
| 7,358,784 B2* | 4/2008 | Kim et al. | | 327/158 |
| 2003/0122598 A1* | 7/2003 | Kim et al. | | 327/158 |
| 2004/0170245 A1* | 9/2004 | Hairapetian et al. | | 375/376 |
| 2005/0093598 A1* | 5/2005 | Jeon et al. | | 327/158 |

FOREIGN PATENT DOCUMENTS

| | | |
|---|---|---|
| KR | 10-2004-0098899 A | 11/2004 |
| KR | 10-2004-0102282 | 12/2004 |
| KR | 10-2004-0103035 | 12/2004 |
| KR | 10-2005-0001152 | 1/2005 |
| KR | 10-2005-0067544 A | 7/2005 |

\* cited by examiner

<EN=HIGH>

<EN=LOW>

SEMICONDUCTOR MEMORY DEVICE

CROSS-REFERENCE TO RELATED APPLICATIONS

The present invention claims priority of Korean patent application number 10-2006-0096352, filed on Sep. 29, 2006, which is incorporated by reference in its entirety.

BACKGROUND OF THE INVENTION

The present invention relates to a semiconductor memory device, and more particularly, to a delay locked loop of a semiconductor memory device.

A semiconductor memory device serves to store data in a system which includes plural semiconductor devices. When a data processing device, e.g., a central processing unit (CPU), requires a data, the semiconductor memory device outputs a data corresponding to an address input by the data requiring device or stores a data received from the data requiring device into memory cells corresponding to the address.

As the operational speed of systems increases and semiconductor integrating technology matures, semiconductor memory devices are required to perform data access operations at higher speed. For performing the data access operation at high speed, synchronous memory devices have been developed for performing data access operations in synchronization with a clock.

To further improve the operational speed of synchronous memory devices, double data rate (DDR) synchronous memory devices have been developed for performing data access operations in synchronization with both the rising and falling edges of a clock.

Since a DDR synchronous memory device inputs or outputs data in synchronization with both the rising and falling edges of the clock, the DDR synchronous memory device should process two pieces of data within one period of the system clock. That is, the DDR synchronous memory device should output a data or store a data at a rising edge and a falling edge of the clock.

Particularly, the output of data from the DDR synchronous memory device should be exactly synchronized with a rising edge or a falling edge of the clock. For this, a data output circuit of the DDR synchronous memory device outputs data in synchronization with a rising edge and a falling edge of the system clock.

However, the clock input for a semiconductor memory device is inevitably delayed as the clock passes through internal units of the semiconductor memory device, e.g., a clock input buffer or a transfer line for transferring a clock signal. If the data output circuit outputs data in synchronization with the delayed clock, an external data requiring device receives data which is not synchronized with its respective rising or falling edge of the clock.

For solving the above-mentioned problem, a semiconductor memory device includes a delay locked loop. The DLL serves to compensate for a delay amount generated while the clock is transferred to the data output clock after the clock is input to the semiconductor memory device.

The DLL detects a delay amount generated while the system clock is transferred through the clock input buffer and the clock signal transfer line and delays the system clock corresponding to the detected delay amount to output the delayed system clock to the data output circuit. That is, by the DLL, the system clock input to the semiconductor memory device is transferred to the data output circuit with being delay-locked.

The data output circuit outputs data in synchronization with the delay locked clock and, thus, an external device receives data that is output in synchronization with the clock. In an actual operation, the delay locked clock output from the DLL is transferred to an output buffer one cycle prior to a point of time when a data should be output, and data is output in synchronization with the transferred delay locked clock. Therefore, data is output faster than a delay amount of the clock generated by internal circuits of the semiconductor memory device while the clock is transferred through the semiconductor memory device.

In this manner, data can be output from a semiconductor memory device in synchronization with a rising edge and a falling edge of a clock input to the semiconductor memory device. As a result, a delay locked loop serves to detect how much faster data should be output in order to compensate for a delay amount of the clock.

Figure 1:
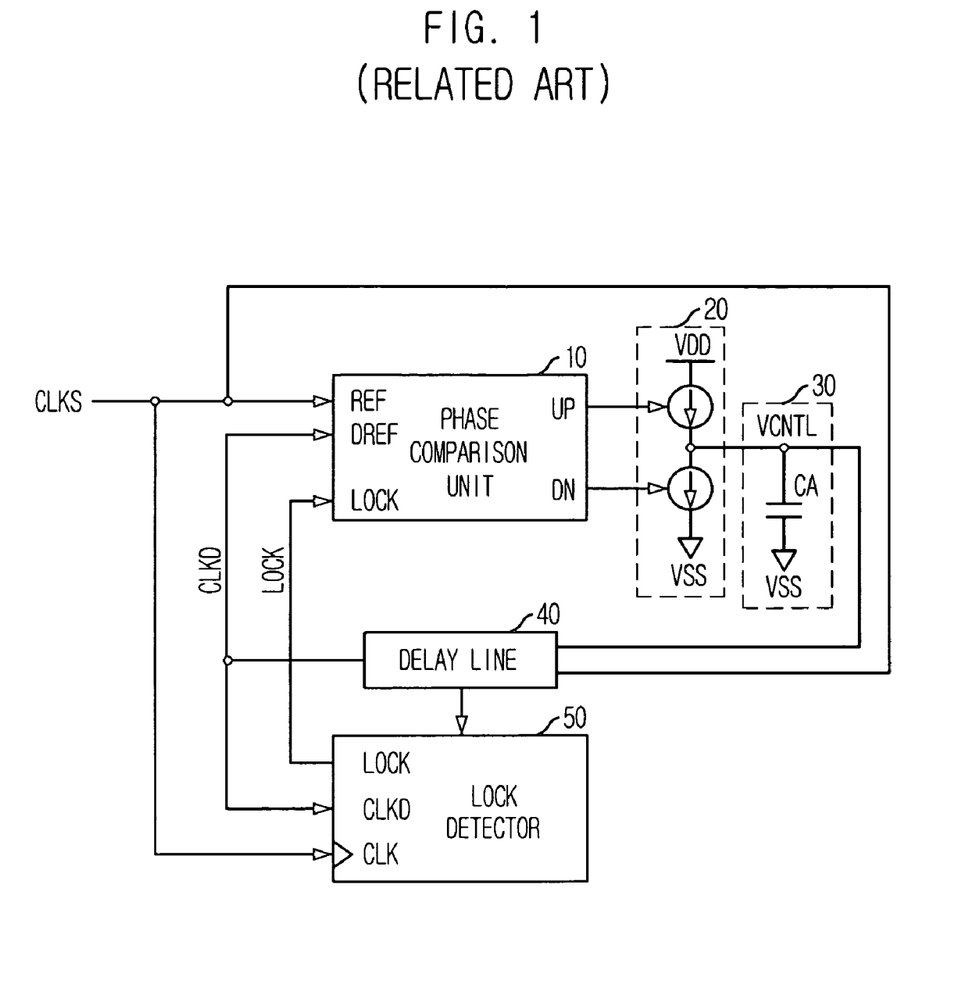
FIG. 1 is a block diagram showing a conventional delay locked loop for use in a semiconductor memory device.

FIG. 1 is a block diagram showing a conventional delay locked loop (DLL) for use in a semiconductor memory device.

The DLL includes a phase comparison unit 10, a charge pump 20, a loop filter 30, a delay line 40 and a lock detector 50.

The phase comparison unit 10 compares each phase of two inputted clock signals CLKS and CLKD in order to output a signal which corresponds to the comparison signal. The charge pump 20 supplies a quantity of charge corresponding to the output signal of the phase comparison unit 10. The loop filter 30 generates a voltage corresponding to the charge quantity supplied by the charge pump 20.

The delay line 40 delays the clock signal CLKS by a delay time corresponding to the voltage generated by the loop filter 30 in order to output the delayed signal as the delayed clock signal CLKD. The lock detector 50 outputs a locking signal LOCK to the phase comparison unit 10 when a phase of the clock signal CLKS is the same as that of the delayed clock signal CLKD so that the phase comparison unit 10 is not operated.

When the locking signal LOCK output from the lock detector 50 is active, a delay locking operation of the DLL is finished. As mentioned above, a delay locked clock of the conventional DLL is used as a reference signal for the semiconductor memory device to output data.

As technology develops, the frequency of a clock input to a semiconductor memory device increases more and more. Accordingly, the frequency of a clock signal delayed and locked by a DLL has increased and a period of the clock signal has decreased.

Since the period of the clock signal is decreased, a delay locking operation of the DLL is more difficult. That is, when the period of the clock signal is decreased, even if the clock signal is slightly changed due to external circumstances, a relatively large variation is generated.

When there is only a small difference between each phase of the two clocks CLKS and CLKD, the difference is very large variation in comparison with the period of the clock signal and, thus, it is difficult for the phase comparison unit 10 to compare phases. Therefore, an operation time of the DDL may be greatly increased. Furthermore, since a delay amount of a delay line is fixed, if a phase difference between the two clocks CLKS and CLKD is larger than the delay amount of the delay line, a delay locking is not easily completed.

SUMMARY OF THE INVENTION

Embodiments of the present invention are directed to providing a semiconductor memory device having a delay locked loop that more correctly and quickly performs a delay locking operation within a delay amount of a delay line.

In accordance with an aspect of the present invention, there is provided a semiconductor memory device, including: a phase comparison unit for comparing a phase of a clock signal with a phase of a reference clock signal; a delay line for delaying the clock signal in response to the comparison result of the phase comparison unit to output the delayed clock signal as the reference clock signal; a first delay locking control unit for adjusting a delay amount of the delay line to generate a locking signal when a phase of an output signal output from the delay line is within a predetermined range; and a second delay locking control unit for adjusting a phase difference between the clock signal and the reference clock signal within a predetermined range in response to an activation of the locking signal so that the phase difference is corrected.

In accordance with another aspect of the present invention, there is provided a method of operating a semiconductor memory device having a phase comparison unit for comparing a phase of a clock signal with a phase of a reference clock signal and a delay line for delaying the clock signal according to the comparison result of the phase comparison unit to output the delayed clock signal as the reference clock signal, including the steps of: adjusting a delay amount of the delay line according to the comparison result of the phase comparison unit; generating a locking signal when a phase of an output signal of the delay line is within a predetermined range; controlling the phase comparison unit in response to the locking signal so that a phase difference between the clock signal and the reference clock signal is adjusted within the predetermined range in order to correct the phase difference; and adjusting a delay amount of the delay line according to the result of the step of controlling the phase comparison unit.

DESCRIPTION OF SPECIFIC EMBODIMENTS

It is an object of the present invention to provide a semiconductor memory device having a delay locked loop for more correctly and quickly performing a delay locking operation within a delay amount of a delay line. Therefore, in accordance with the present invention, a delay locking time of a delay locked loop can be dramatically reduced. Further, without greatly increasing a delay amount of a delay line included in a delay locked loop, a delay locking operation can be performed at high speed. Accordingly, a semiconductor memory device can output data at higher speed.

Hereinafter, a delay locked loop in accordance with the present invention will be described in detail referring to the accompanying drawings.

Figure 2:
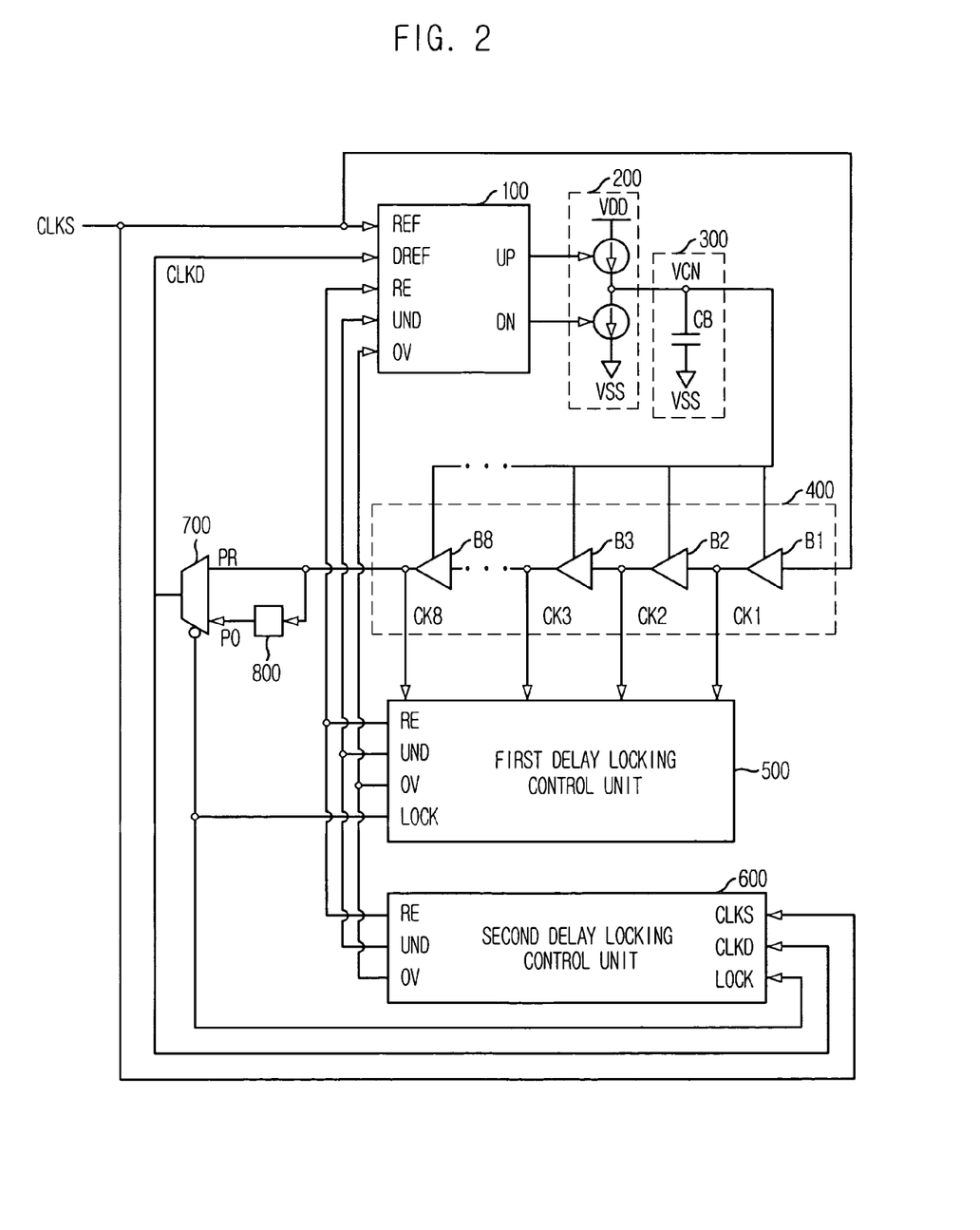
FIG. 2 is a block diagram illustrating a delay locked loop (DLL) for use in a semiconductor memory device in accordance with an embodiment of the present invention.

FIG. 2 is a block diagram illustrating a delay locked loop (DLL) for use in a semiconductor memory device in accordance with an embodiment of the present invention.

The DLL includes a phase comparison unit 100, a charge pump 200, a loop filter 300, a delay line 400, a first delay locking control unit 500, a second delay locking control unit 600, a multiplexer 700 and a delay unit 800.

The phase comparison unit 100 compares a phase of a clock signal CLKS with that of a reference clock signal CLKD in order to generate an up signal UP and a down signal DN according to the comparison result. Further, the phase comparison unit 100 generates the up signal UP and the down signal DN in response to an up control signal OV and a down control signal UND. A control signal RE inactivates both of the up signal UP and the down signal DN.

The charge pump 200 pumps a charge to an output terminal in response to the up signal UP and discharges the output terminal in response to the down signal DN. The loop filter 300 generates a charge voltage VCN in response to the charge quantity charged or discharged by the charge pump 200.

The delay line 400 delays the clock signal CLKS for a delay amount corresponding to a voltage level of the charge voltage VCN. The delay line 400 includes a plurality of individual delay elements connected in series. Each delay element delays its input signal for a amount of time corresponding to the voltage level of the charge voltage VCN generated by the loop filter 300.

The first delay locking control unit 500 receives output signals of the individual delay elements to generate the up control signal OV, the down control signal UND and the control signal RE. Further, the first delay locking control unit 500 activates a locking signal LOCK after activating the control signal RE. Herein, when a phase difference between the clock signal CLKS and the reference clock signal CLKD input to the phase comparison unit 100 is within a half period of the clock signal CLKS, the control signal RE is activated.

The second delay locking control unit 600 is enabled in response to the locking signal LOCK to generate the up control signal OV and the down control signal UND so that a phase of the reference clock signal CLKD is synchronized with a phase of the clock signals CLKS within a half period of clock signal CLKS. The phase comparison unit 100 activates the up signal UP or the down signal DN in response to the up control signal OV and the down control signal UND.

The multiplexer 700 selects one of a clock signal PR output from the delay line 400 and a delayed clock signal PO delayed by the delay unit 800 in order to output the selected signal as the reference clock signal CLKD.

Figure 3:
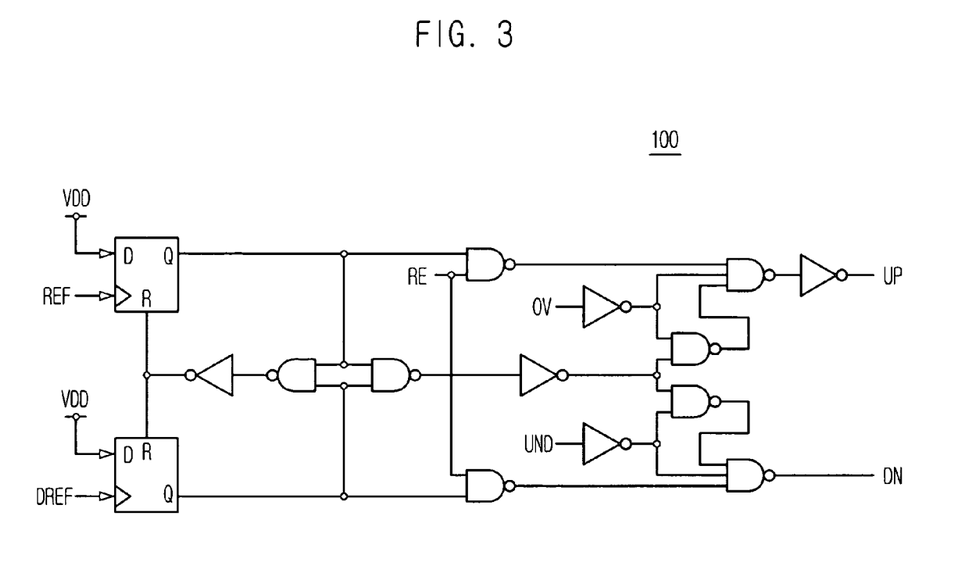
FIG. 3 is a schematic circuit diagram depicting a phase comparison unit of the DLL shown in FIG. 2.

FIG. 3 is a schematic circuit diagram depicting the phase comparison unit 100 shown in FIG. 2.

The phase comparison unit 100 receives the clock signal CLKS and the reference clock signal CLKD through a first input terminal REF and a second input terminal DREF respectively. When the phase of the clock signal CLKS leads that of the reference clock signal CLKD, the up signal UP is activated; when the phase of the clock signal CLKS lags behind that of the reference clock signal CLKD, the down signal DN is activated.

Further, when the control signal RE is activated, both of the up signal UP and the down signal DN are inactivated. When the up control signal OV is activated, the up signal UP is activated; when the down control signal UND is activated, the down signal DN is activated.

Figure 4:
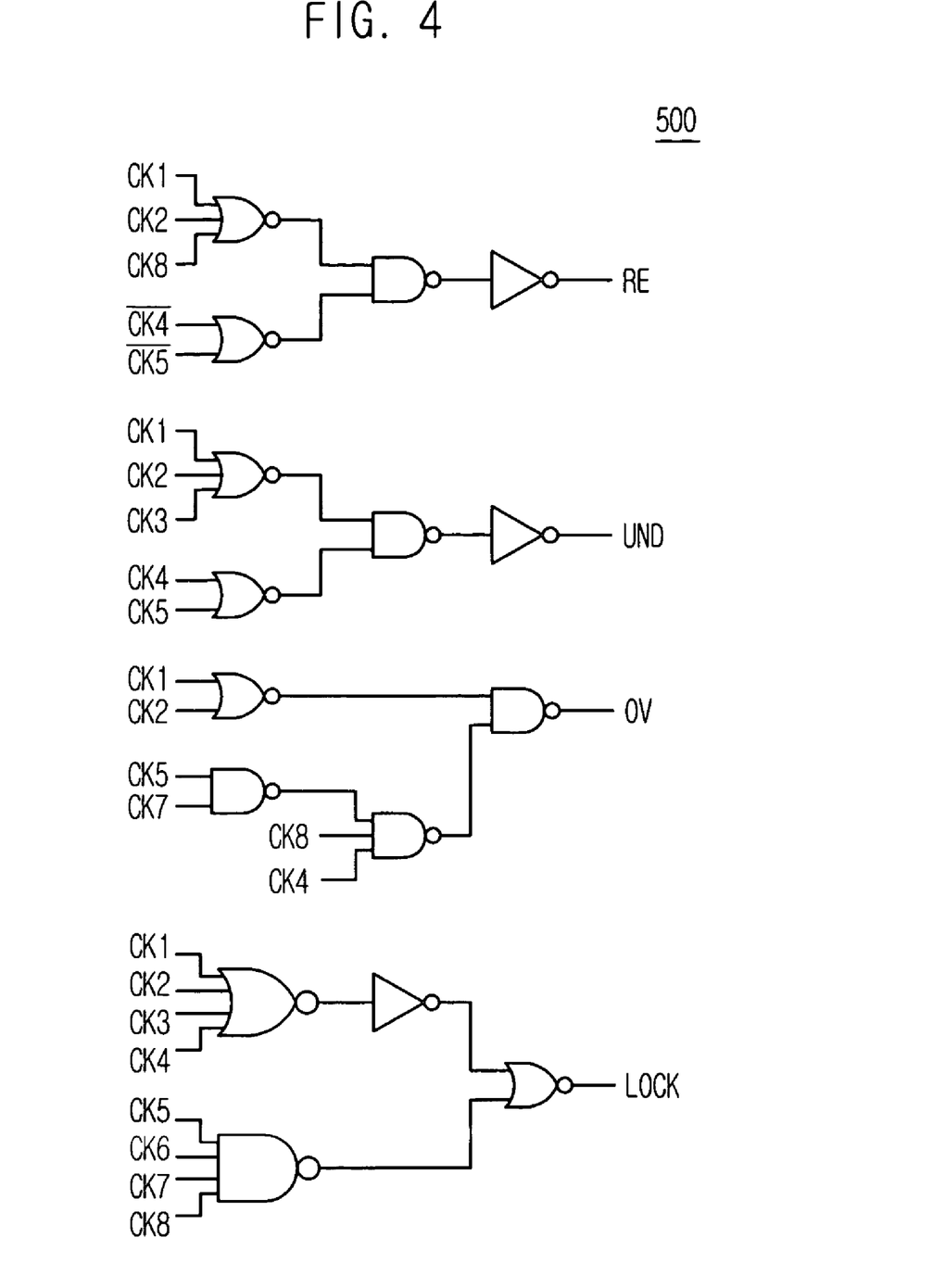
FIG. 4 is a schematic circuit diagram showing a first delay locking control unit of the DLL shown in FIG. 2.

FIG. 4 is a schematic circuit diagram showing the first delay locking control unit 500 shown in FIG. 2.

The first delay locking control unit 500 combines output signals of the unit delay elements included in the delay line 400 to generate the control signal RE, the up control signal OV and the down control signal UND. Further, the locking signal LOCK is activated when a phase difference between the clock signal CLKS and the reference clock signal CLKD is within a predetermined period.

Figure 5:
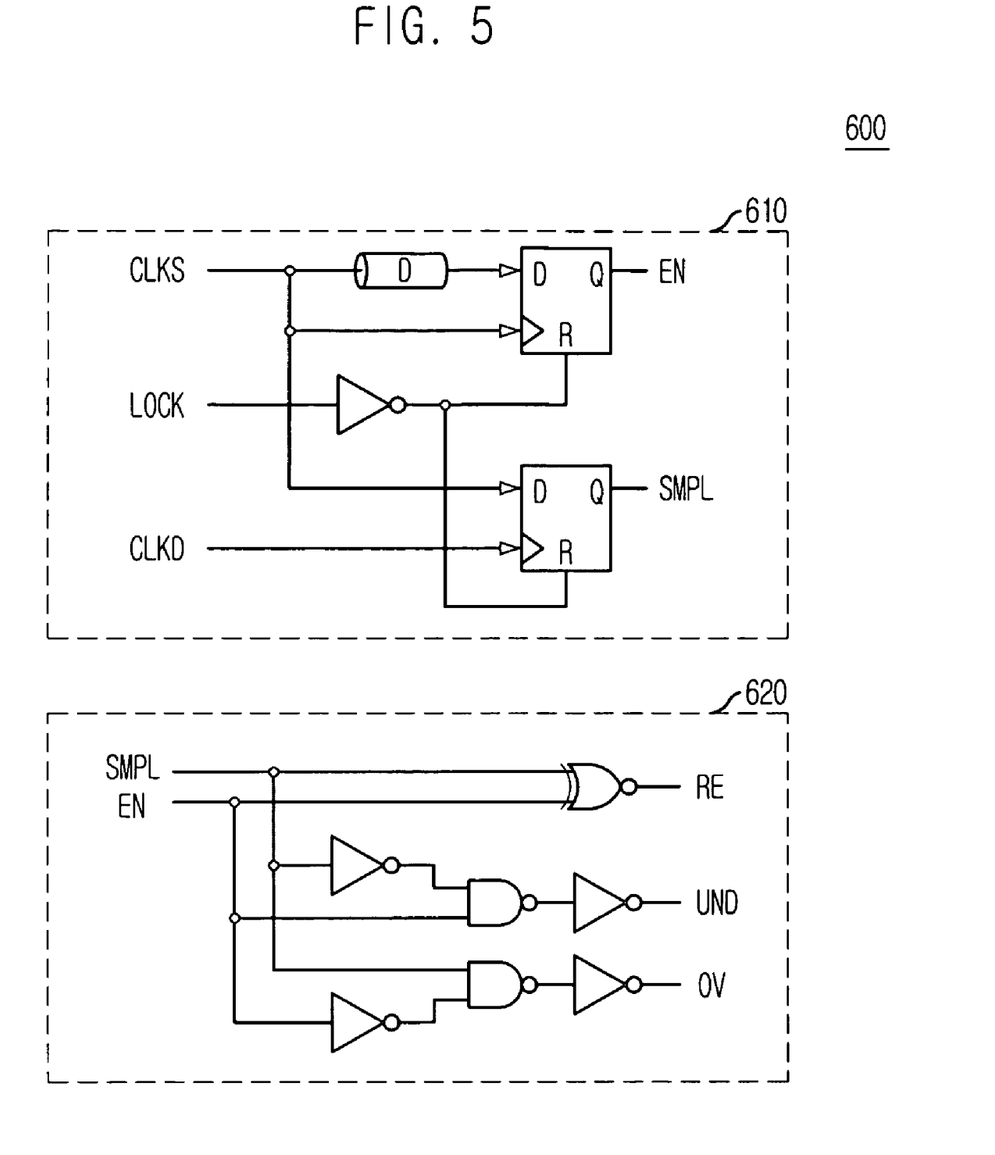
FIG. 5 is a schematic circuit diagram illustrating a second delay locking control unit of the DLL shown in FIG. 2.

FIG. 5 is a schematic circuit diagram illustrating the second delay locking control unit 600 shown in FIG. 2.

The second delay locking control unit 600 includes a detection signal generation unit 610 and a control signal generation unit 620.

The detection signal generation unit 610 is enabled in response to the locking signal LOCK in order to generate detection signals EN and SMPL which have a different logic value according to whether a transition timing of the clock signal CLKS leads or lags behind that of the reference clock signal CLKD. The control signal generation unit 620 generates the control signals such as RE, UND, OV for controlling the comparison result signal output from the phase comparison unit 100 in response to the detection signals EN and SMPL.

Figure 6:
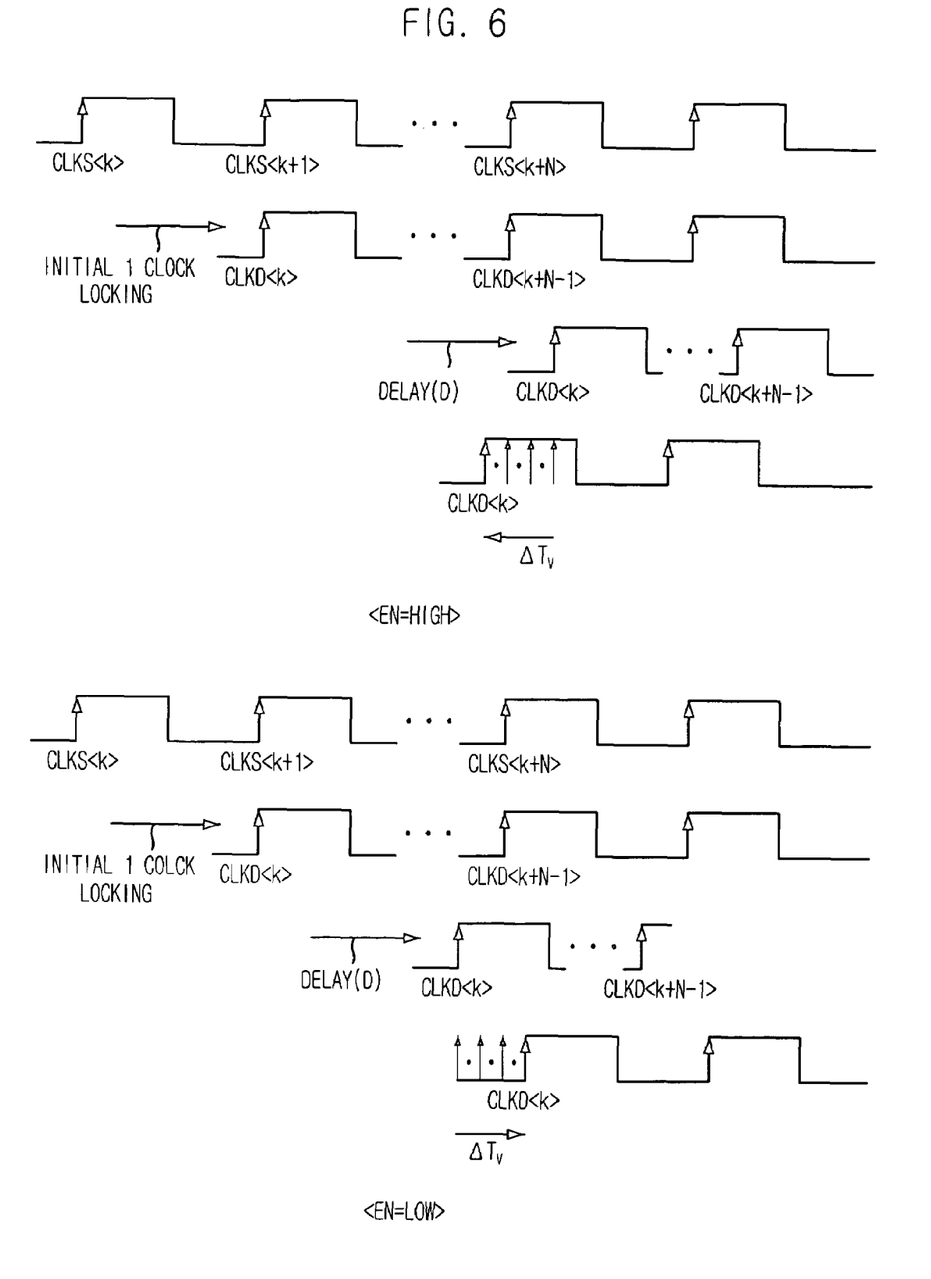
FIG. 6 is a wave diagram showing an operation of the semiconductor memory device shown in FIG. 2.

FIG. 6 is a wave diagram showing an operation of the semiconductor memory device shown in FIG. 2.

Referring to FIGS. 2 to 6, the operation of the semiconductor memory device is described below.

A process of generating a delay locked clock can be divided into two processes. A first process is performed by the first delay locking control unit 500 and a second process is performed by the second delay locking control unit 600.

To begin, the first locking process performed by the first delay locking control unit 500 is described below.

At an initial state when the semiconductor memory device is supplied with a power supply voltage, the multiplexer 700 outputs the clock signal PR output from the delay line 400 as the reference clock signal CLKD.

The phase comparison unit 100 activates the up signal UP or the down signal DN according to a phase difference between the clock signal CLKS and the reference clock signal CLKD. The charge pump 200 performs a charge pumping operation according to the up signal UP and the down signal DN. According to the pumping operation result, the charge voltage VCN is loaded on the loop filter 300. The delay line 400 delays the clock signal CLKS for a delay amount which corresponds to a voltage level of the charge voltage VCN.

The first delay locking control unit 500 utilizes the output signals of the unit delay elements included in the delay line 400 to generate the control signal RE, the up control signal OV and the down control signal UND. The phase comparison unit 100 outputs the up signal UP or the down signal DN in response to the control signal RE, the up control signal OV and the down control signal UND. In response to the up signal UP or the down signal DN, a voltage level of the charge voltage VCN is determined so that a delay amount of the delay line 400 is adjusted.

When a phase difference between the clock signal CLKS and the reference clock signal CLKD input to the phase comparison unit 100 is within a range as shown in the first equation, the first delay locking control unit 500 activates the control signal RE and the locking signal LOCK.

$$0.75T < \Phi < 1.25T \quad [\text{Eq. 1}]$$

Herein, "T" denotes a period of the clock signal CLKS and "Φ" denotes a phase difference between the clock signal CLKS and the reference clock signal CLKD.

When an activated locking signal LOCK is input to the multiplexer 700, the multiplexer 700 outputs the delayed clock signal PO output from the delay unit 800 as the reference clock signal CLKD.

Subsequently, the second locking process performed by the second delay locking control unit 600 is described below.

The detection signal generation unit 610 included in the second delay locking control unit 600 generates the detection signals EN and SMPL which have a different logic value according to whether a phase of the clock signal CLKS leads or lags behind a phase of the reference clock signal CLKD.

When a phase of the clock signal CLKS leads a phase of the reference clock signal CLKD, a logic level of the detection signal EN becomes a logic low level. Then, the control signal generation unit 620 included in the second delay locking control unit 600 generates the up control signal OV so that the phase difference between the clock signal CLKS and the reference clock signal CLKD is decreased. In this manner, the phase difference is continuously decreased until a phase of the clock signal CLKS lags behind a phase of the reference clock signal CLKD.

When a phase of the clock signal CLKS lags behind a phase of the reference clocks signal CLKD, the second delay locking control unit 600 activates the control signal RE so that a delay amount of the delay line 400 is not changed.

At this timing of delay locking, a time delay amount (Tv) of the delay line 400 is within a range between 0.5T and T, i.e., 0.5T<Tv<T.

Meanwhile, when a phase of the clock signal CLKS further lags behind a phase of the reference clock signal CLKD, a logic level of the detection signal EN becomes a logic high level. Then, the control signal generation unit 620 included in the second delay locking control unit 600 generates the down control signal UND so that the phase difference between the clock signal CLKS and the reference clock signal CLKD is decreased. In this manner, the phase difference is continuously decreased until a phase of the clock signal CLKS leads a phase of the reference clock signal CLKD.

When a phase of the clock signal CLKS leads a phase of the reference clock signal CLKD, the second delay locking control unit 600 activates the control signal RE so that a delay amount of the delay line 400 is not changed.

At this timing of delay locking, the time delay amount Tv of the delay line 400 is within a range between 1T and 1.5T, i.e., 1T<Tv<1.5T.

When the detection signal EN is a logic high level, one cycle is increased more than the minimum n value of Tv+Td=nT so that a struck locking phenomenon due to a Tv minimum value can be prevented and, thus, a stable locking operation can be secured.

The following second equation shows each case where the detection signal EN is a high level and the detection signal EN is a low level.

$$EN=\text{High for } (n+0.5)T<\Phi<(n+1)T \, n=0, 1, 2, 3, \ldots$$

$$EN=\text{Low for } nT<\Phi<(n+0.5)T \, n=0, 1, 2, 3, \quad [\text{Eq. 2}]$$

A locking cycle according to a time delay amount of the delay line 400 follows the third equation shown below.

$$\text{Lock cycle}=T, \text{ for } 0<d<0.5T \, n=1$$

$$\text{Lock cycle}=nT, \text{ for } (n-1.5)T<d<(n-0.5)T \, n=2, 3, 4, \quad [\text{Eq. 3}]$$

As shown in the third equation, a time delay amount variation of the delay line 400 has a maximum value of 0.5T regardless of a locking cycle at the locking operation mode controlled by the second delay locking control unit 600. Therefore, an operational linearity of the delay line 400 is secured and a locking operation is quickly completed.

As above-described, in accordance with the preferred embodiment of the present invention, a variable delay time is restricted between 0.5T and 1.5T, i.e., 0.5T<Tv<1.5T. Therefore, a mis-locking due to a struck locking or a harmonic locking can be prevented. Further, by providing a minimum locking cycle adapted to a minimum delay amount of a delay line, a locking operation can be rapidly performed.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
    a phase comparison unit for comparing a phase of a clock signal with a phase of a reference clock signal;
    a delay line for delaying the clock signal according to the comparison result of the phase comparison unit to output the delayed clock signal as the reference clock signal;
    a first delay locking control unit for adjusting a delay amount of the delay line to generate a locking signal when a phase of an output signal output from the delay line is within a predetermined range; and
    a second delay locking control unit for adjusting a phase difference between the clock signal and the reference clock signal within a predetermined range in response to an activation of the locking signal so that the phase difference is corrected.

2. The semiconductor memory device as recited in claim 1, further comprising a multiplexer for outputting one of the output signal of the delay line and a delayed signal of the output signal of the delay line to the phase comparison unit and the second delay locking control unit.

3. The semiconductor memory device as recited in claim 2, further comprising:
    a charge pumping unit for pumping a charge according to a comparison result of the phase comparison unit; and
    a loop filter for generating a voltage corresponding to a quantity of the pumped charge and for supplying the voltage to the delay line so that the delay amount of the delay line is adjusted.

4. The semiconductor memory device as recited in claim 3, wherein the delay line includes a plurality of individual delay elements connected in series whose delay amount is adjusted according to the voltage supplied by the loop filter.

5. The semiconductor memory device as recited in claim 4, wherein the first delay locking control unit includes:
    a phase adjusting signal generation unit for generating a control signal in order to control the phase comparison unit by generating an up signal or a down signal by performing a logic operation upon the output signals of the individual delay elements; and
    a locking signal generation unit for generating the locking signal by performing a logic operation upon the output signals of the individual delay elements.

6. The semiconductor memory device as recited in claim 5, wherein the second delay locking control unit includes:
    a detection signal generation unit enabled in response to an activation of the locking signal for generating a detection signal which has a different logic value according to whether a transition timing of the clock signal is earlier than or later than that of the reference clock signal; and
    a control signal generation unit for generating at least one control signal in response to the detection signal so that a comparison result of the phase comparison unit is controlled by the control signal.

7. The semiconductor memory device as recited in claim 6, wherein the predetermined range is about half of the period of the clock signal.

8. A method of operating a semiconductor memory device having a phase comparison unit for comparing a phase of a clock signal with a phase of a reference clock signal and a delay line for delaying the clock signal in response to the comparison result of the phase comparison unit, the method comprising:
    adjusting a delay amount of the delay line according to the comparison result of the phase comparison unit;
    generating a locking signal when a phase of an output signal of the delay line is within a predetermined range;
    controlling the phase comparison unit in response to the locking signal so that a phase difference between the clock signal and the reference clock signal is adjusted within the predetermined range in order to correct the phase difference;
    adjusting the delay amount of the delay line according to the result of the control of the phase comparison unit, and
    outputting one of an output signal of the delay line and a delayed signal of the output signal of the delay line as the reference clock signal.

9. The method as recited in claim 8, wherein the predetermined range is about half of the period of the clock signal.

* * * * *